United States Patent
Lee et al.

(10) Patent No.: US 9,066,416 B2
(45) Date of Patent: Jun. 23, 2015

(54) POWER SUPPLY ENCLOSURE AND METHOD OF MANUFACTURING THE SAME

(71) Applicant: Chicony Power Technology Co., Ltd., New Taipei (TW)

(72) Inventors: Chih-Hang Lee, New Taipei (TW); Yung-Hung Hsiao, New Taipei (TW); Pei-Li Chang, New Taipei (TW); Yen-Ming Chen, New Taipei (TW); Chi-Chang Ho, New Taipei (TW)

(73) Assignee: CHICONY POWER TECHNOLOGY CO., LTD., New Taipei (TW)

( * ) Notice: Subject to any disclaimer, the term of this patent is extended or adjusted under 35 U.S.C. 154(b) by 184 days.

(21) Appl. No.: 13/749,532

(22) Filed: Jan. 24, 2013

(65) Prior Publication Data

US 2014/0202726 A1    Jul. 24, 2014

(51) Int. Cl.
| | |
|---|---|
| H05K 5/04 | (2006.01) |
| H05K 5/00 | (2006.01) |
| B23P 15/00 | (2006.01) |

(52) U.S. Cl.
CPC ......... *H05K 5/0013* (2013.01); *Y10T 29/49956* (2015.01); *Y10T 29/49826* (2015.01); *Y10T 29/49963* (2015.01)

(58) Field of Classification Search
CPC ..... H05K 5/04; H05K 5/0008; H05K 5/0004; Y10T 29/49826; Y10T 29/49956; Y10T 29/49963; Y10T 29/53443
USPC ........... 29/428, 525.11, 525.06, 801; 174/50, 174/38
See application file for complete search history.

(56) References Cited

U.S. PATENT DOCUMENTS 4,129,743 A * 12/1978 Lohsl .............................. 174/38

FOREIGN PATENT DOCUMENTS

| TW | 200410624 A | 6/2004 |
|---|---|---|
| TW | M318745 U | 9/2007 |
| TW | 201215279 A1 | 4/2012 |

OTHER PUBLICATIONS

Office Action Dated Aug. 12, 2014 of the Corresponding Taiwan Patent Application No. 101141876.

* cited by examiner

*Primary Examiner* — John C Hong
(74) *Attorney, Agent, or Firm* — Chun-Ming Shih; HDLS IPR Services

(57) ABSTRACT

In a power supply enclosure and a method of manufacturing the same, the power supply enclosure is divided into an independent top cover, an independent bottom base, as well as two independent side panels. The top cover, the bottom base, and the side panels are formed by blanking. After extruded hole, punching or bending processes by using a change core method, the top cover and the bottom base were made, followed by assembling the two side panels on the two sides between the top cover and the bottom base to form the power supply enclosure group.

4 Claims, 6 Drawing Sheets

POWER SUPPLY ENCLOSURE AND METHOD OF MANUFACTURING THE SAME

BACKGROUND

1. Technical Field

The present application relates to a power supply, and more particularly, to a power supply enclosure and a method of manufacturing the same.

2. Related Art

As shown in FIG. 1, the enclosure of a conventional power supply includes an enclosure 1a made by sheet metal stamping, bending, and assembling. The enclosure 1a includes a top cover 10a and a bottom base 11a. The top cover 10a and the bottom base 11a are formed by different die stamping, followed by bending process, respectively. The bottom base 11a includes a side panel 110a integrally formed thereon by a punching process and a bending process. The top cover 10a is disposed on the bottom base 11a to complete the power supply enclosure 1a.

However, the power supply with different specifications often results in enclosures 1a in different shapes and dimensions. Even if the top cover 10a and the bottom base 11a have the same dimension, the design of the side panels 110a may vary. Therefore, every component of the enclosure may require specific corresponding dies to carry out mass production. In other words, a variety of different dies is required for mass production of the enclosures of power supplies with various specifications. However, the cost of the power supply in mass production compared with the cost of the enclosure in die developments is non-proportional. The lower production volume is difficulty to recover the development cost of die.

BRIEF SUMMARY

The present application provides a power supply enclosure and a method of manufacturing the same. The enclosure of power supply can be divided into four independent components, comprising a top cover, a bottom base and two side panels respectively. Using a small amount of dies through change core method can integrate diversified dimensions and shapes, so as to respond the production needs on a variety of different specifications of the power supply enclosure assembly. The manufacturing steps are as follows:

a) forming the power supply enclosure from a top cover, a bottom base and two side panels independent with each other;

b) using blanking to form the top cover, the bottom base and two side panels;

c) using a change core method to perform an extruded hole process or a punching hole process on the top cover and bottom base formed in step b);

d) performing a bending process on the top cover and bottom base formed in step c) and on the two side panels formed from step b);

e) assembling the two side panels on two sides between the top cover and the bottom base to form the e power supply enclosure.

A power supply enclosure assembly is obtained by performing the above method for manufacturing the power supply enclosure assembly.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
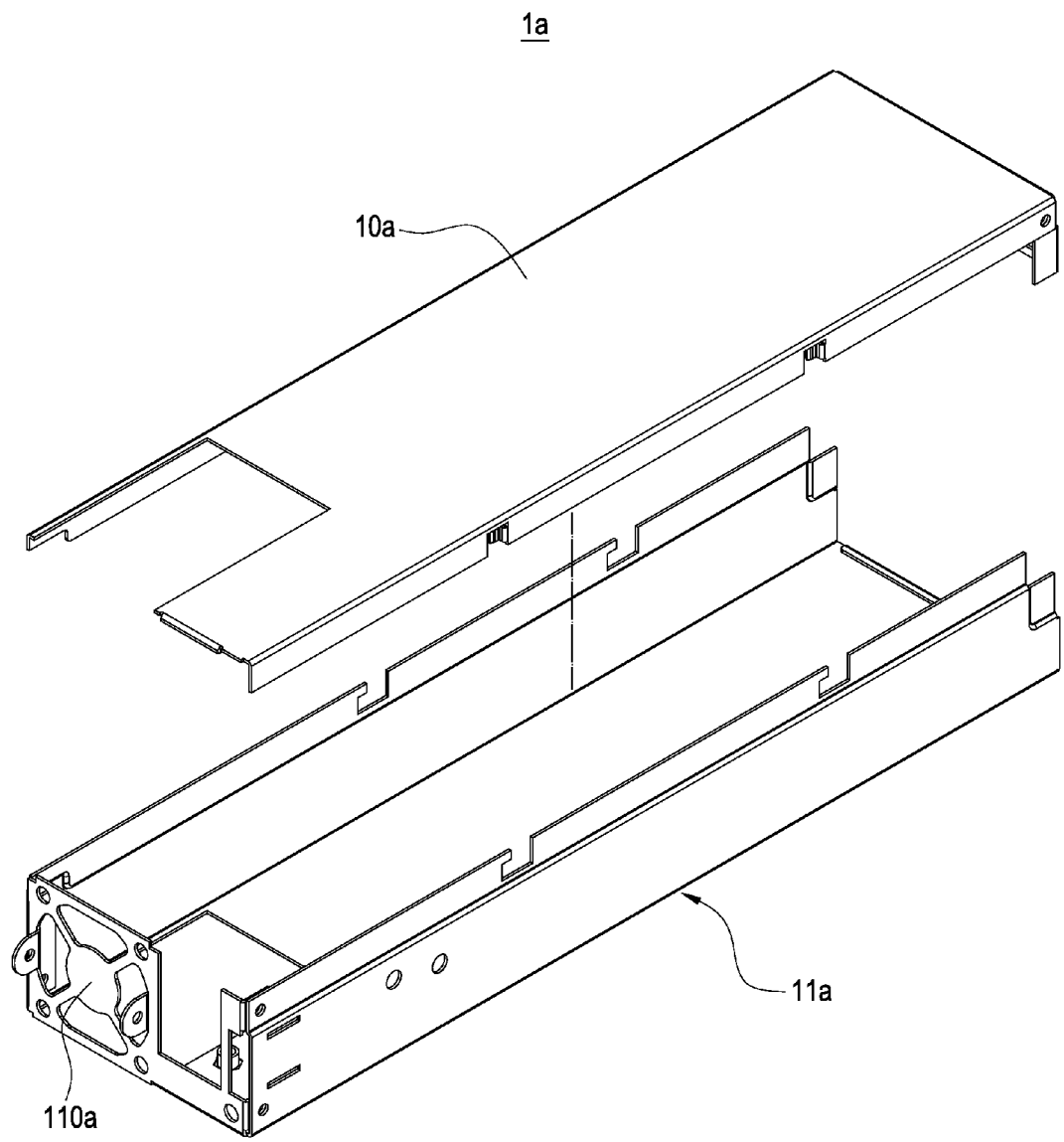
FIG. 1 is an exploded view of a conventional power supply enclosure assembly.
Figure 2:
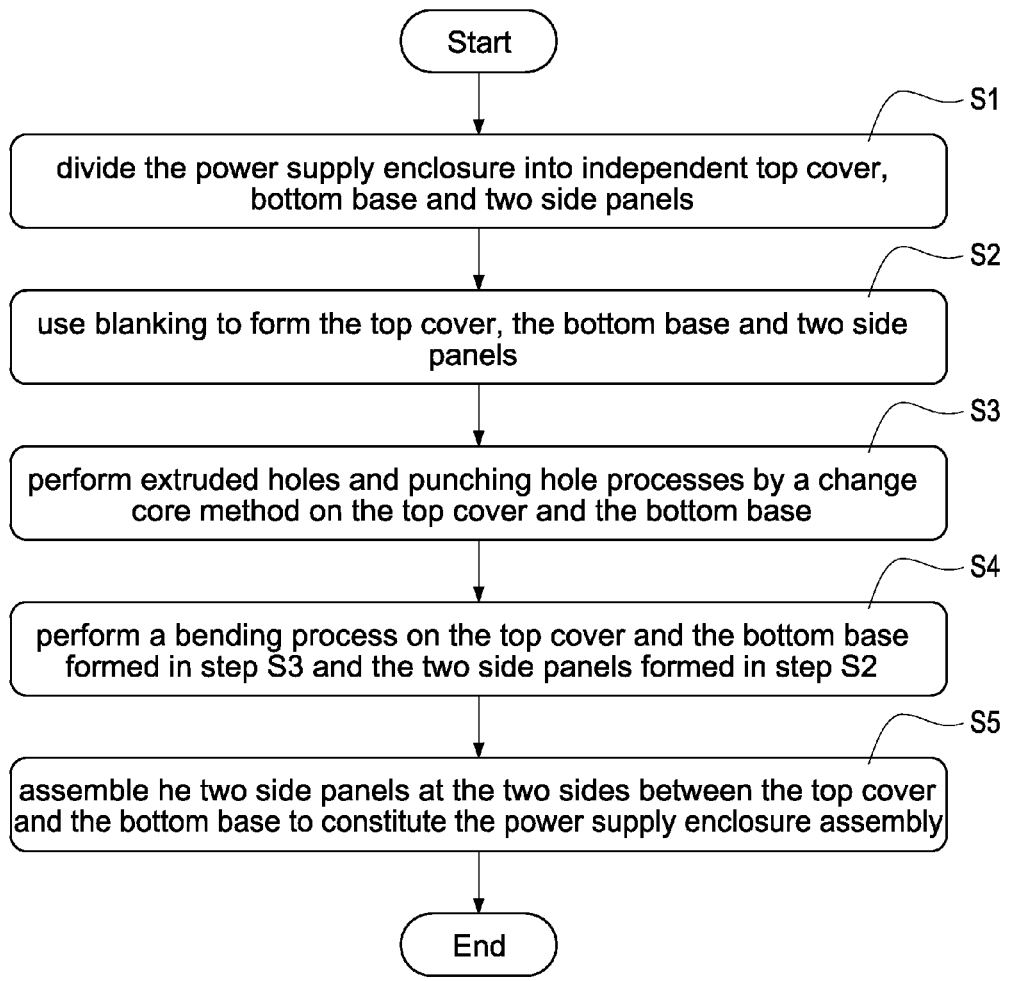
FIG. 2 shows a process flow of the present application.
Figure 3:
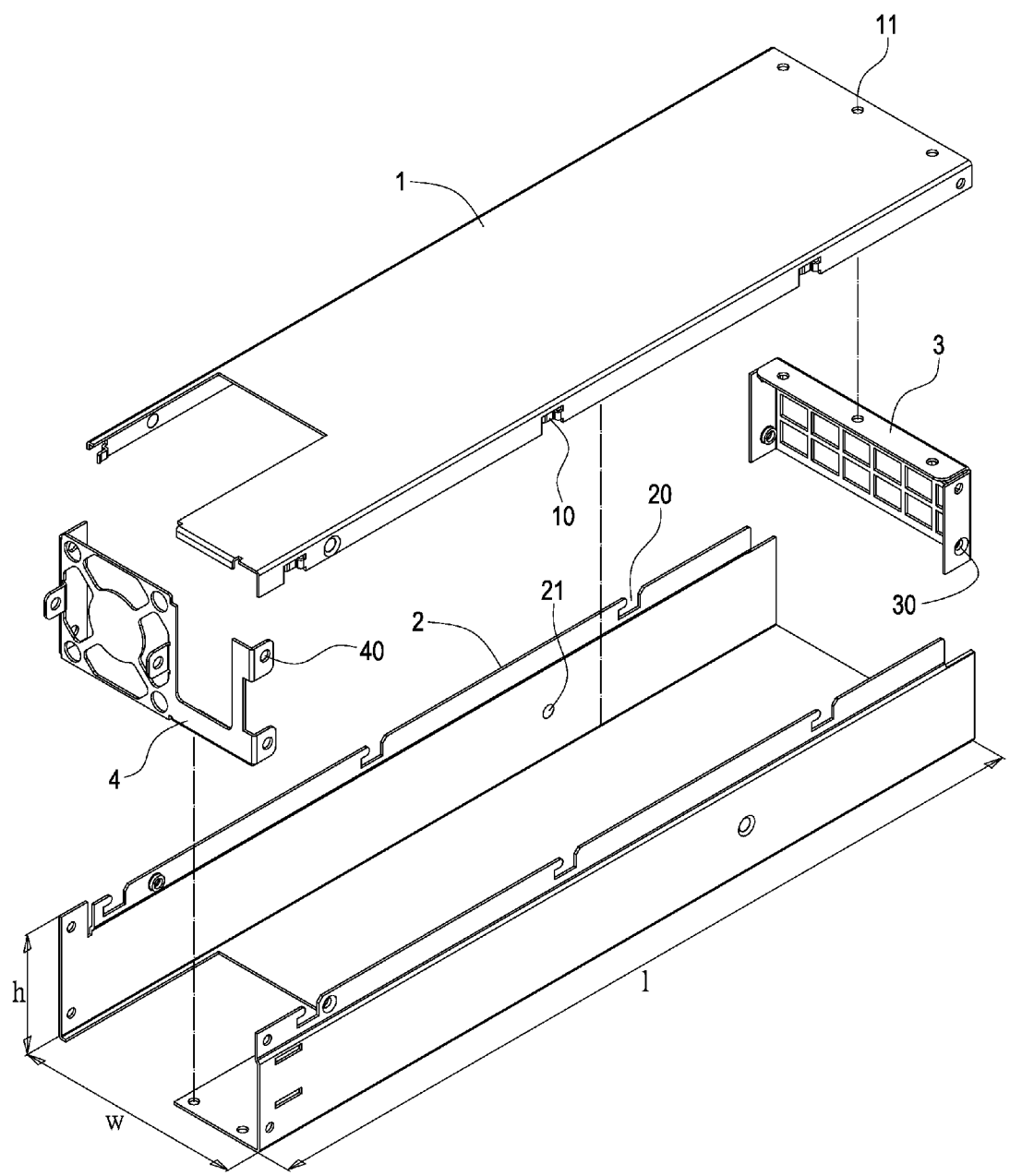
FIG. 3 is an exploded view of a power supply enclosure according to the present application.

Please refer to FIG. 2 and FIG. 3. FIG. 2 is process flow of the present application and FIG. 3 shows the exploded view of the power supply enclosure assembly according to one embodiment of the present application. A power supply enclosure and a manufacturing method of the same are provided. The power supply enclosure can be divided into an independent top cover 1, an independent bottom base 2 and two independent side panels 3 and 4 as shown in FIG. 2. FIG. 3 shows that the present application has more flexibility in the use of die by means of change core method to achieve the purpose on meeting a variety of different enclosure specifications. As shown, the design allows the bottom base 2 and two side panels 3 and 4 to be disassemble into three independent components. The power supply enclosure can be constructed by four detachable components, including the bottom base 2, the two side panels, and the top cover 1.

The following processes can be carried out on each of the four components respectively. In step S2 as shown in FIG. 2, blanking is used for performing sheet metal forming process to form the top cover 1, the bottom base 2 and two side panels 3 and 4. The two side panels 3 and 4 are formed separately such that the two side panels 3 and 4 can response different side panel designs. The two side panels are then assembled with the bottom base 2. When any design change occurs to the side panels 3 and 4, inconvenience and cost waste can be reduced by re-assembling the modified side panels with the bottom base 2 without reproducing the bottom base 2.

In step S3 as shown in FIG. 2, extruded holes or punching holes processes are performed on the top cover 1 and the bottom base 2 through a change core method. As the extruded holes 10 and 20 and punching holes 11 and 21 performed on the top cover 1 and the bottom base 2 provide dies for the corresponding processes, the dies can be modified corresponding to designs with different specifications, so as to satisfy the specifications of various designs in the extruded holes 10 and 20 and the punching holes 11 and 21. For example, adjustments of relative positions can be adjusted according to the length l, width w, and height h (as shown in FIG. 3) of the extruded holes 10 and 20 or the punching holes 11 and 21 on the top cover 1 or the bottom base 2. Multiple hole positions are preset by core and provide the relative cutting tool positions for extruded holes 10 and 20 or punching holes 11 and 21. In the present embodiment, if the two side panels 3 and 4 can be assembled with the bottom base 2 by means of screw, process of punching holes 30 and 40 can also be further provided in this step.

In step S4 as shown in FIG. 2, the bending processes are carried out on the top cover 1, the bottom base 2, and the two side panels 3 and 4 formed in step S2. Similarly, during the bending processes on top cover 1, bottom base 2, and the two side panels 3 and 4, corresponding dies are provided for the forming processes. Thus core is adjusted corresponding to various design specifications, so as to satisfy the variety of dimensions required for bending process on the top cover 1, bottom base 2, and the side panels 3 and 4 with various dimensions.

Figure 4:
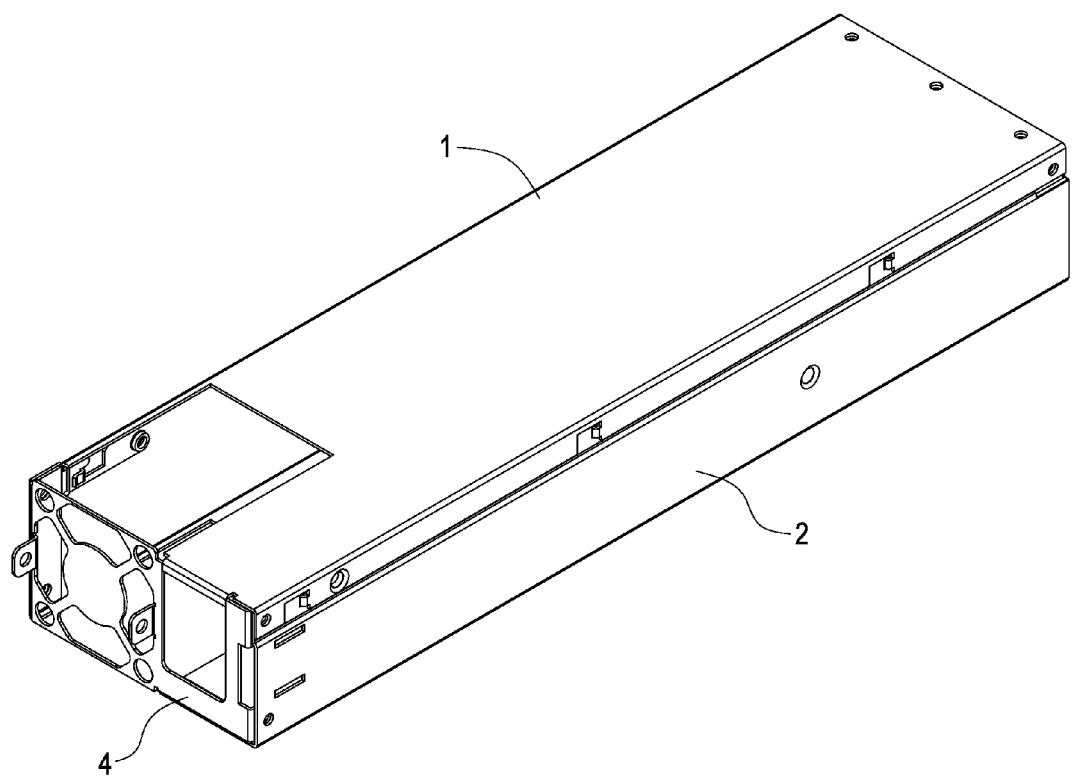
FIG. 4 is an exploded view of the power supply enclosure according to the present application.

In step S5 as shown in FIG. 2, the two side panels 3 and 4 are assembled at the two sides between the top cover 1 and the bottom base 2. The assembly can be performed by a bonding method such as the aforementioned screws or rivets to combine the bottom base 2 together to constitute the power supply enclosure assembly (as shown in FIG. 4).

Figure 5:
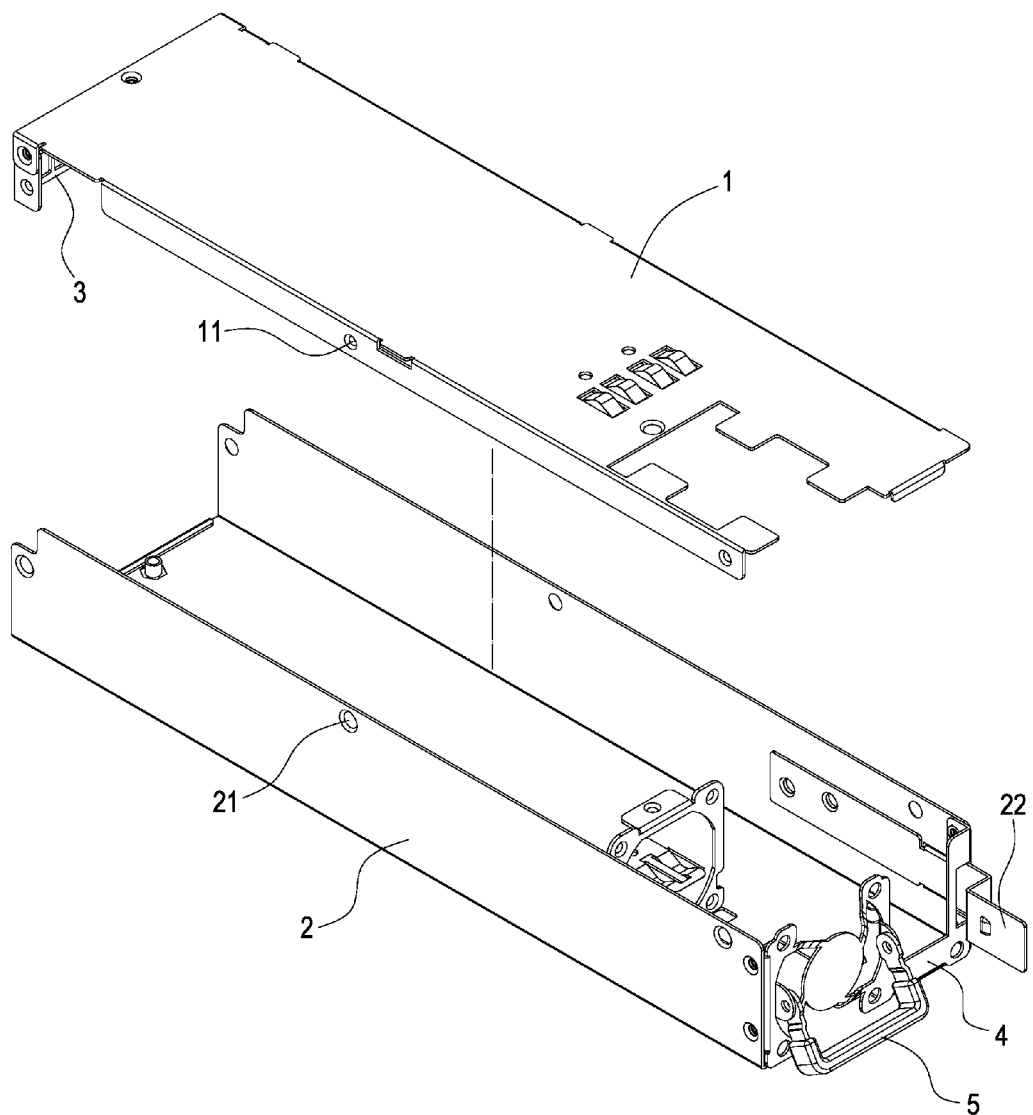
FIG. 5 shows another embodiment of power supply enclosure according to the present application.
Figure 6:
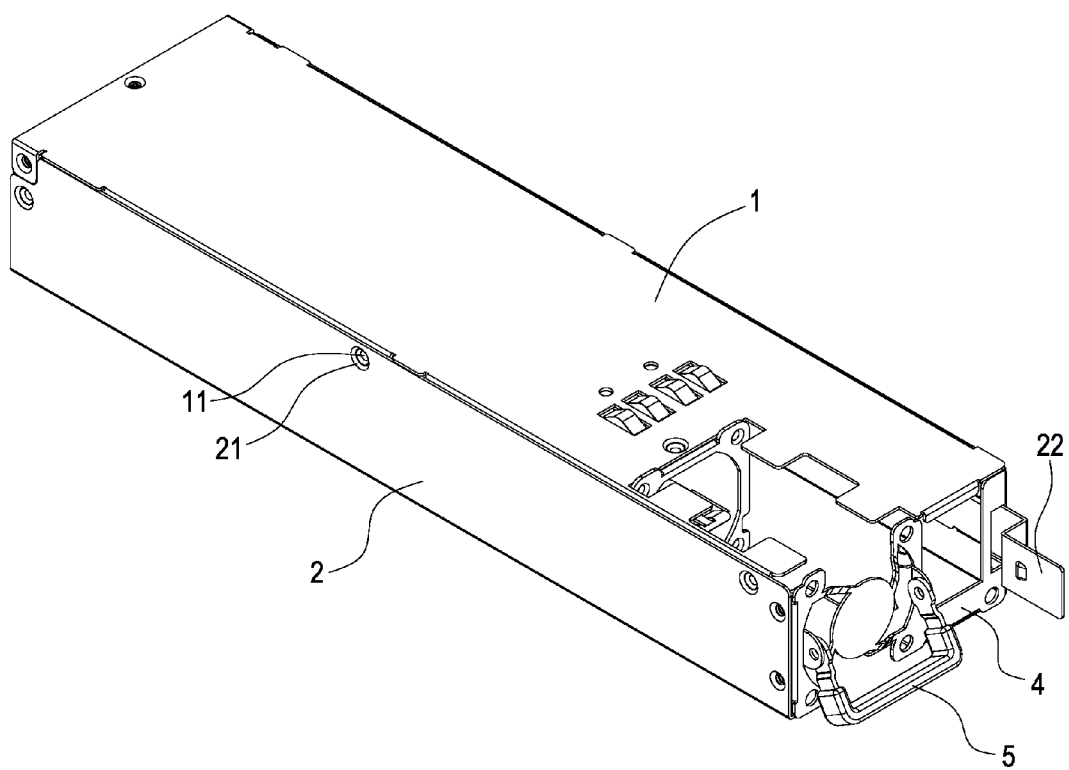
FIG. 6 shows another embodiment of power supply enclosure according to the present application.

FIGS. 5 and 6 show the exploded and assembled view of a power supply enclosure in another embodiment are presented. In this embodiment, the top cover and the bottom base 2 can be connected to each by means of screws or similar devices through the punching holes 11 and 21. A handle 5 may be pivotally formed on at least one of the side panels 3 and 4 (side panel 4 is selected as an example in this embodiment), so as to comply with the requirements of other design for the power supply enclosure.

Thus, the present application provides a power supply enclosure and the manufacturing method of the same that may requires more sets of dies for manufacturing the structure with the same specification. However, the power supply enclosure will not have only one specification in general production. So for the needs to produce a variety of different dimensions and specifications, the present application separates the power supply enclosure into four components and uses change core method to utilize a small amount of dies to have multiple dimensions or shapes. These can respond to the production needs of the power supply enclosure group with a variety of different specifications. The present application also may have the following advantages:

1. The power supply enclosure was separated into four components (traditional is two or three components) so that the combination of those components provides more flexibility. This flexibility will not be restricted by the problems of replacing new dies if enclosure structure needs modifications.

2. Based on the above description in item 1, components after separating can have advantages on sharing multiple dies to meet a variety of different product specifications. Even though the required production volume is lower (such as less than 30 K), there will be no concerns of excessive cost on die developments.

3. Based on the description in item 2, multiple sets of dies can be shared and arranged so that there is no need to develop unnecessary dies to increase production cost.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A manufacturing method of a power supply enclosure assembly, comprising:
    forming a power supply enclosure assembled by four independent and detachable pieces, wherein the four independent and detachable pieces are a top cover, a bottom base and two side panels, respectively, and the four independent and detachable pieces are formed by four corresponding independent dies;
    forming the top cover, the bottom base and the two side panels by blanking;
    using a change core method to perform an extruded hole process or a punching hole process on the top cover and the bottom base, wherein the change core method means providing cores with different specifications to be processed to produce an extruded hole on the top cover or a punching hole on the bottom base, and multiple hole positions are preset by the cores and provide relative cutting tool positions for the extruded hole or the punching hole, so as to satisfy the specifications of various designs in the extruded hole and the punching hole;
    performing a bending process on the top cover and the bottom base after using the change core method and the two side panels formed by blanking, the top cover, the bottom base, and the two side panels being bent according to a specification which is used to adjust corresponding cores; and
    assembling the two side panels at two sides between the top cover and the bottom base.

2. The method of claim 1, further comprising performing the punching process on the two side panels.

3. The method of claim 1, further comprising connecting the two side panels on the bottom base by screws for assembling the two side panels between the top cover and the bottom base.

4. The method of claim 1, further comprising connecting the two side panels on the bottom base by rivets for assembling the two side panels between the top cover and the bottom base.

* * * * *